United States Patent
Abiko et al.

(10) Patent No.: US 7,643,347 B2
(45) Date of Patent: Jan. 5, 2010

(54) SEMICONDUCTOR MEMORY DEVICE

(75) Inventors: Naofumi Abiko, Yokohama (JP); Masahiro Yoshihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/335,093

(22) Filed: Dec. 15, 2008

(65) Prior Publication Data
US 2009/0161436 A1    Jun. 25, 2009

(30) Foreign Application Priority Data
Dec. 21, 2007    (JP)    ............................. 2007-330288

(51) Int. Cl.
*G11C 11/34* (2006.01)

(52) U.S. Cl. ............................. 365/185.17; 365/185.25; 365/185.21

(58) Field of Classification Search ............ 365/185.17, 365/185.25, 185.21, 203, 195, 189.07, 189.03, 365/185.24, 226, 185.22, 185.19
See application file for complete search history.

(56) References Cited

U.S. PATENT DOCUMENTS

| | | | |
|---|---|---|---|
| 5,524,094 A | 6/1996 | Nobukata et al. | |
| 5,841,698 A * | 11/1998 | Hirano et al. | 365/185.21 |
| 6,496,033 B2 * | 12/2002 | Rees | 326/38 |
| 6,856,563 B2 | 2/2005 | Kim et al. | |
| 6,879,520 B2 | 4/2005 | Hosono et al. | |
| 7,023,736 B2 | 4/2006 | Cernea et al. | |
| 2008/0291743 A1 | 11/2008 | Edahiro et al. | |

FOREIGN PATENT DOCUMENTS

JP    2006-508483    3/2006

* cited by examiner

*Primary Examiner*—Dang T Nguyen
(74) *Attorney, Agent, or Firm*—Oblon, Spivak, McClelland, Maier & Neustadt, L.L.P.

(57) ABSTRACT

The semiconductor memory device related to an embodiment of the present invention including a memory string in which a plurality of memory cells are connected, a bit line connected to an end of the memory string, a power supply circuit which generates a voltage or a current related to an operation state of each memory cell, a sense amplifier which supplies a control voltage or a control current which controls an operation state of each memory cell via the bit line according to the voltage or the current generated in the power circuit, and a transient response adjustment circuit which adjusts the transient response characteristics of the voltage or the current generated in the power supply circuit when the sense amplifier supplies to the bit line the control voltage or the control current which shifts the memory string from a first operation state to a second operation state.

16 Claims, 11 Drawing Sheets

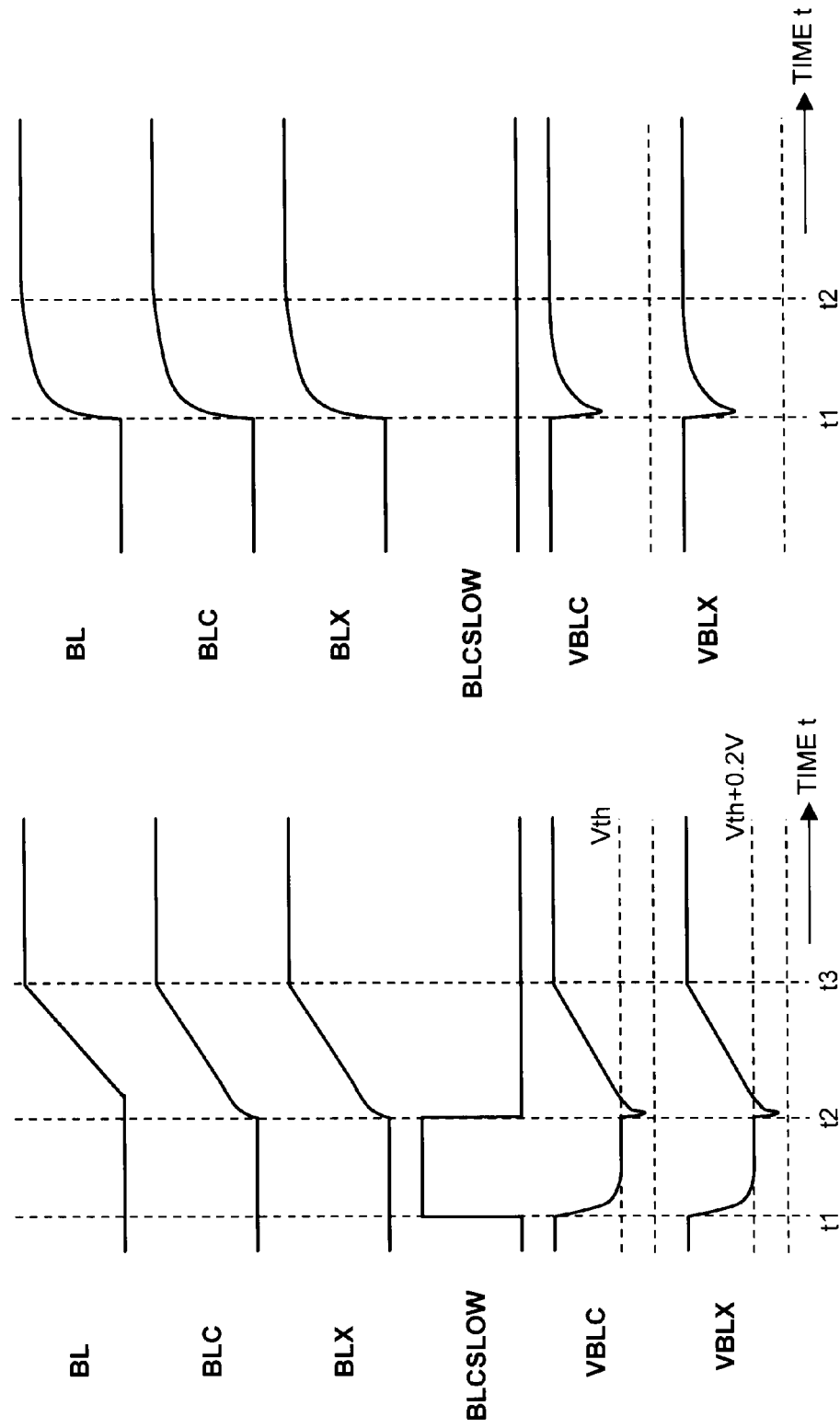

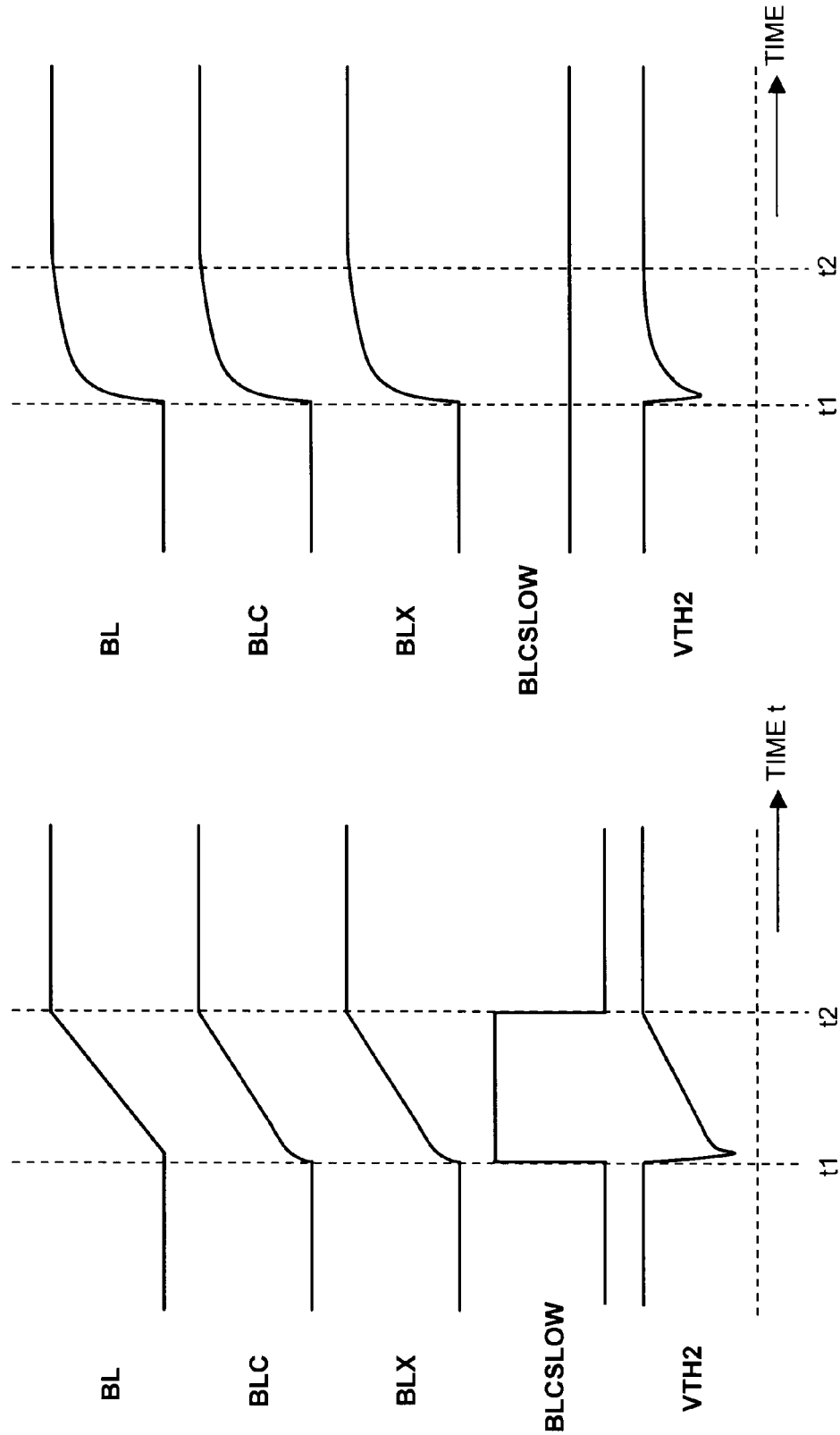

SEMICONDUCTOR MEMORY DEVICE

CROSS REFERENCE TO RELATED APPLICATION

This application is based upon and claims the benefit of priority from the prior Japanese Patent Application No. 2007-330288, filed on Dec. 21, 2008, the entire contents of which are incorporated herein by reference.

BACKGROUND OF THE INVENTION

1. Field of the Invention

This invention is related to a semiconductor memory device and in particular a semiconductor memory device arranged with a sense amplifier circuit for each memory string.

2. Description of the Related Art

In semiconductor memory devices such as NAND type flash memory, demand for semiconductor memory devices is increasing along with an increase in the uses of large volumes data. For example, in a NAND type flash memory, it is possible to store much more data with a reduction in chip size by a multi-bit technology in which two bits of data can be stored in one memory cell. In this type of semiconductor memory device, a plurality of memory strings with a plurality of memory cells connected in series, are arranged in parallel, a bit line BL is connected to each memory string, a word line WL is shared connection for each of a plurality of memory cells in a row direction and because access is possible in units of a page, data throughput is improved.

In order to further improve data throughput in the above stated semiconductor memory device, it is preferred that all the memory cells which are connected to one word line WL are read simultaneously. In this case, a sense amplifier circuit is connected to each bit line BL and it is necessary to prevent a decrease in bit line BL level detected by a sense amplifier circuit so that a pair of bit lines connected to adjacent memory strings are not affected by capacitive coupling.

In the above stated structure in which a sense amplifier circuit is connected to each bit line BL, a nonvolatile memory which is structured so that the detection operations of a sense amplifier circuit are not hindered while also preventing a decrease in bit line BL level is, for example, disclosed in Japan Laid Open Patent 2006-508483.

The above stated nonvolatile memory includes a structure in which a source line bias error is reduced which is generated by a current flowing to a finite resistance component which exists in a source line is reduced when the source line of a plurality of memory cells is grounded. This source line bias error makes a detection operation of a sense amplifier circuit incorrect. As a result, in the above stated nonvolatile memory, memory cells which have a conducting current higher than a boundary current value are identified and the generation of source line bias error is reduced by grounding the bit lines which are related to these identified memory cells.

BRIEF SUMMARY OF THE INVENTION

The semiconductor memory device related to an embodiment of the present invention includes a memory string in which a plurality of memory cells are connected, a bit line connected to an end of the memory string, a power supply circuit which generates a voltage or a current related to an operation state of each memory cell of the plurality of memory cells within the memory strings, a sense amplifier circuit which supplies a control voltage or a control current which controls an operation state of each memory cell of the plurality of memory cells within the memory string via the bit line according to the voltage or the current generated in the power supply circuit, and detects an operation state of the memory string, and a transient response adjustment circuit which adjusts the transient response characteristics of the voltage or the current generated in the power supply circuit when the sense amplifier circuit supplies to the bit line the control voltage or the control current which shifts the memory string from a first operation state to a second operation state.

The semiconductor memory device related to an embodiment of the present invention includes a memory string in which a plurality of memory cells are connected, a bit line connected to an end of the memory string, a power supply circuit which generates a voltage or a current related to an operation state of each memory cell of the plurality of memory cells within the memory strings, a sense amplifier circuit which supplies a control voltage or a control current which controls an operation state of each memory cell of the plurality of memory cells within the memory string via the bit line according to the voltage or the current generated in the power supply circuit, and detects an operation state of the memory string, a transient response adjustment circuit which adjusts the transient response characteristics of a charge voltage or a charge current generated in the power supply circuit when the sense amplifier circuit supplies to the bit line the control voltage or the control current which controls a charge operation of the memory string, and an adjustment value setting circuit which sets an adjustment value which adjusts the transient response characteristics of the charge voltage or the charge current.

BRIEF DESCRIPTION OF THE DRAWINGS

FIG. 7A is a timing chart of each signal related to a charging operation by a gate generation circuit 600 related to the first embodiment.

FIG. 7B is a timing chart of each signal related to a charging operation by a gate generation circuit 400 related to the first embodiment.

FIG. 9A is a timing chart of each signal related to a charging operation when a voltage signal BLCS LOW is input in the gate voltage generation circuit 800 related to the second embodiment.

FIG. 9B is a timing chart of each signal related to a charging operation when a voltage signal BLCS LOW is not input in the gate voltage generation circuit 800 related to the second embodiment.

DETAILED DESCRIPTION OF THE INVENTION

Figure 1:
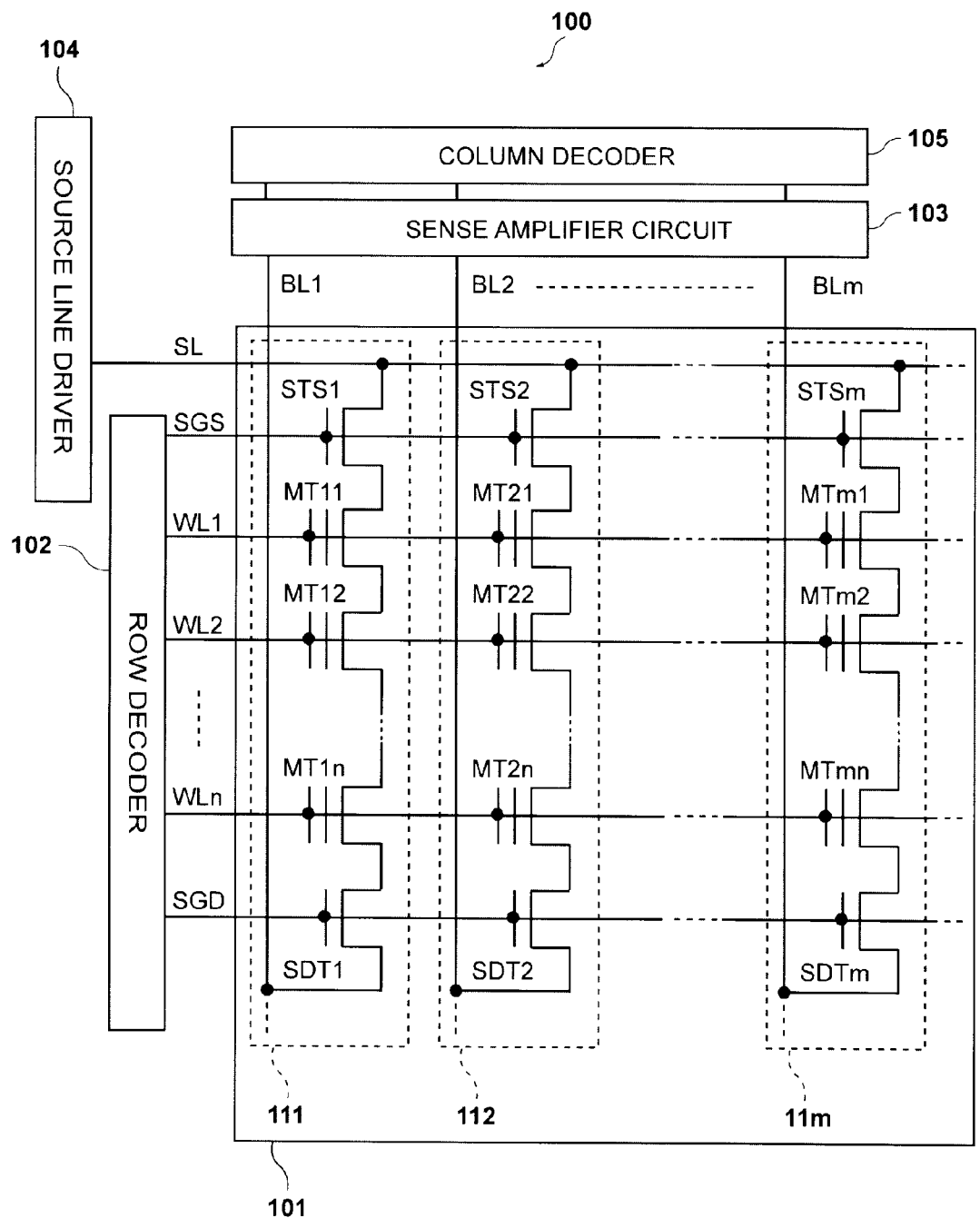
FIG. 1 is a diagram which shows an outline structure of a NAND type flash memory related to a first embodiment.

The embodiments of the present invention will be explained below while referring to the drawings. In the semiconductor memory device related to the embodiments, the NAND type flash memory will be explained as an example. Furthermore, the same structural elements have the same symbols and therefore explanations will be omitted in some embodiments to avoid repetition.

First Embodiment

FIG. 1 is a diagram which shows an outline structure of a NAND type flash memory related to a first embodiment. As is shown in FIG. 1, a NAND flash memory 100 includes m×n (m and a are integers) memory cell transistors MT11-MT1$n$, MT21-MT2$n$, . . . , MTm1-MTmn, in a cell array 101. In the cell array 101, a plurality of memory cell transistors MT11-MT1$n$, MT21-MT2$n$, . . . , MTm1-MTmn, are arranged as a group in a column direction. By arranging this group of memory cell transistors MT11-MT1$n$, MT21-MT2$n$, . . . , MTm1-MTmn in a row direction, the plurality of memory cell transistors MT11-MT1$n$, MT21-MT2$n$, . . . , MTm1-MTmn are arranged in the shape of a matrix.

The memory cell transistors MT11-MT1$n$, a source side selection gate transistor STS1 and a drain side selection gate transistor STD1 are connected in series forming a memory string. A drain terminal of the source side selection gate transistor STS1 which selects the memory cell transistors MT11-MT1$n$, is connected to a source terminal of the memory cell transistor MT11. A source terminal of the drain side selection gate transistor STD1 which selects the memory cell transistors MT11-MT1$n$, is connected to the drain terminal of the memory cell transistor MT1$n$. The source side selection gate transistors STS2-STSm, the memory cell transistors MT21-MT2$n$, . . . , MTm1-MTmn and the drain side selection gate transistors STD2-STDm are each respectively connected in series and form memory strings 112, . . . , 11$m$.

A common source line SL is connected to the source terminal of the source side selection gate transistors STS1-STSm. A source line driver 104 which supplies a voltage to the common source line SL is connected to the common source line SL. A common selection gate line SGS is connected to each gate terminal of the source side selection gate transistors STS1-STSm. The selection gate line SGS is connected to a row decoder 102. A common selection gate line SGD is connected to each gate terminal of the drain side selection gate transistors STD1-STDm. The selection gate line SGD is connected to the row decoder 102. A common word line WL1 is connected to each gate terminal of the memory cell transistors MT11, MT21, . . . , MTm1. A common word line WL2-WLn is connected to each gate terminal of the memory cell transistors MT12, MT22, . . . , MTm2, MT1$n$, MT2$n$, . . . , MTmn. The word lines WL1-WLn are connected to the row decoder 102. Bit lines BL1-BLm are each respectively connected to the drain terminal of the drain side selection gate transistors STD1-STDm.

The row decoder 102 decodes a row address signal and selectively supplies the row address decode signal to the word line WL1-WLn and the selection gate lines SGS and SGD. A column decoder 105 decodes a column address signal and obtaining a column address decode signal, selects one of the bit lines BL1-BLm based on the column address decode signal. A sense amplifier circuit 103 amplifies a memory signal read out from the memory cell transistor selected by the row decoder 102 and the column decoder 105.

Figure 2:
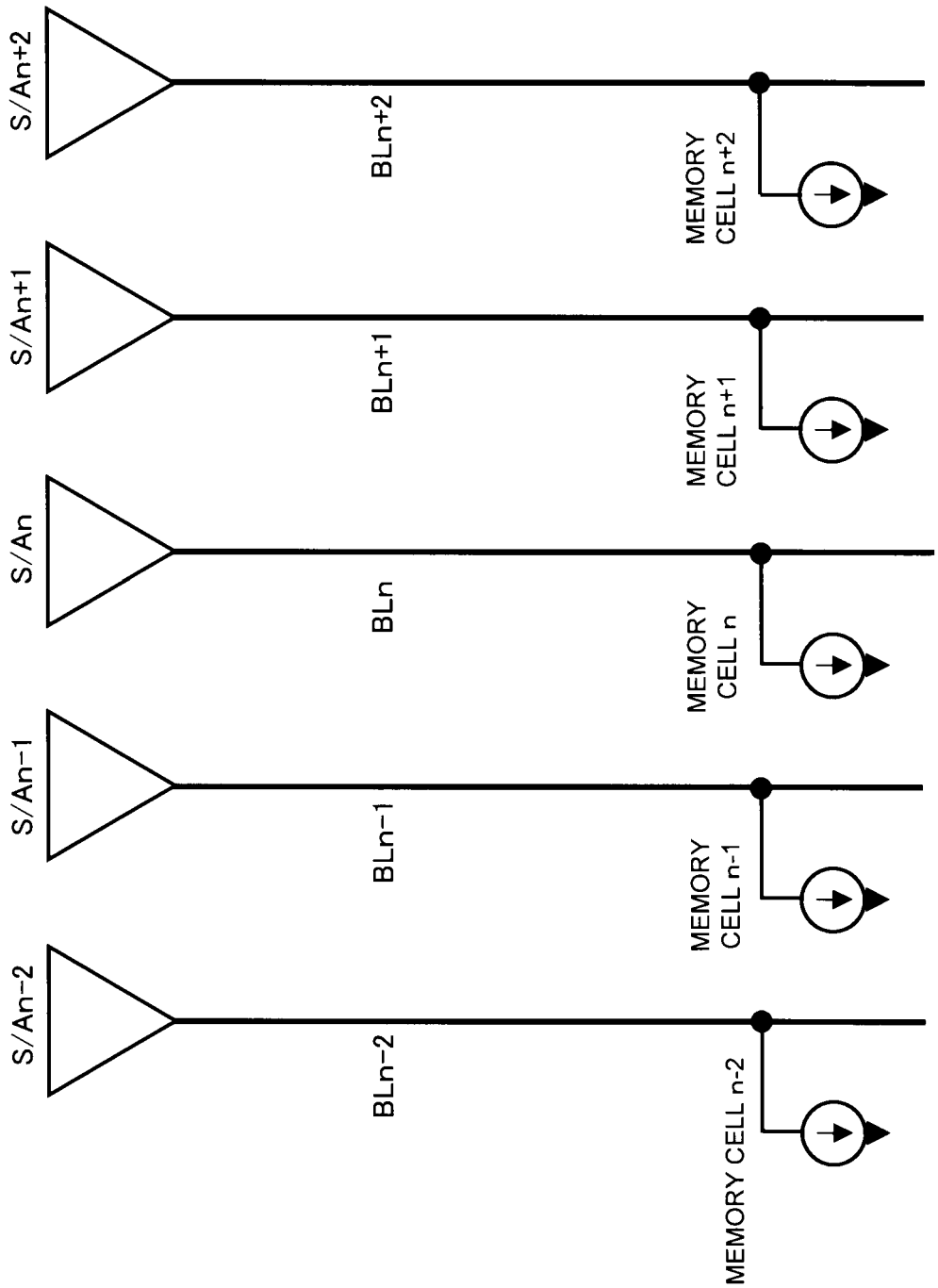
FIG. 2 is a diagram which shows an outline of the inside of a sense amplifier circuit shown in FIG. 1 related to the first embodiment.

Next, an outline structure of inside the sense amplifier circuit 103 shown in FIG. 1 is shown in FIG. 2. As is shown in FIG. 2, the sense amplifier circuit 103 has a structure in which sense amplifiers S/An−2, S/An−1, S/An, S/An+1, S/An+2 are respectively connected to each of the bit line BLn−2, BLn−1, BLn, BLn+1, BLn+2. Furthermore, sense amplifiers S/A for five circuits are shown in FIG. 2, however, actually, the sense amplifier circuit 103 has a structure in which sense amplifiers S/A are connected to each of the bit lines BL1-BLm shown in FIG. 1.

Figure 3:
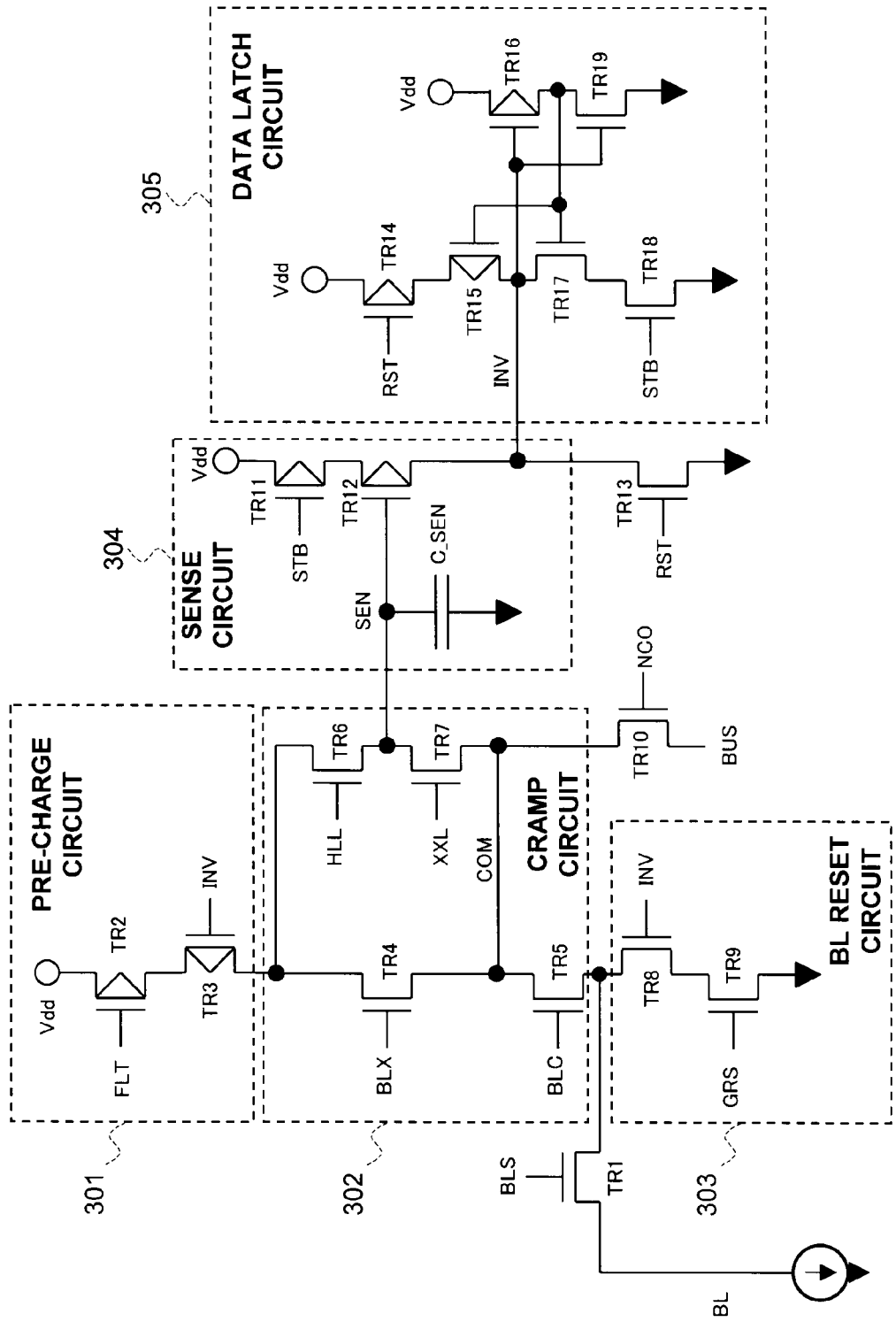
FIG. 3 is a diagram which shows a circuit structure of one circuit of the sense amplifier S/A related to the first embodiment.

Next, the circuit structure shown in FIG. 3 is the sense amplifier S/A shown in FIG. 2 for one circuit. As is shown in FIG. 3, the sense amplifier S/A includes a pre-charge circuit 301, a cramp circuit 302, a BL reset circuit 303, a sense circuit 304, a data latch circuit 305, a high-voltage NMOS transistor TR1 and NMOS transistors TR10 and TR13.

The pre-charge circuit 301 is comprised of PMOS transistors TR2 and TR3. In the PMOS transistor TR2, a source terminal is connected to a power supply terminal, a gate terminal is connected to an FLT input terminal and a drain terminal is connected to the source terminal of the PMOS transistor TR3. In the PMOS transistor TR3, a gate terminal is connected to an INV input terminal, and a drain terminal is connected to the cramp circuit 302. The pre-charge circuit 301 operates by voltage signals FLT and INV which are input from an external control circuit for example (not shown in the diagram), and controls a pre-charge operation of the bit lines BL and sense circuit 304.

The cramp circuit 302 is comprised of NMOS transistors TR4-TR7. In the NMOS transistor TR4, a source terminal is connected to the pre-charge circuit 301, a gate terminal is connected to a BLX input terminal and a drain terminal is connected to the source terminal of the NMOS transistor TR5. In the NMOS transistor TR5, a gate terminal is connected to a BLC input terminal and a drain terminal is connected to the BL reset circuit 303. In the NMOS transistor TR6, a source terminal is connected to the pre-charge circuit 301, a gate terminal is connected to a HLL input terminal and a drain terminal is connected to the source terminal of the NMOS transistor TR7 and the sense circuit 304. In the NMOS transistor TR7, a gate terminal is connected to an XXL input terminal and a drain terminal is connected to the source terminal of the NMOS transistor TR10. In addition, each source terminal of the NMOS transistors TR4, TR7 is connected by a node COM. The cramp circuit 302 operates by voltage signals VBLX, VBLC, HLL and VXXL input from an external control circuit for example (not shown in the diagram) and sets a pre-charge voltage which is supplied to the bit lines BL and sense circuit 304.

The BL reset circuit 303 is comprised of NMOS transistors TR8, TR9. In the NMOS transistor TR8, a source terminal is connected to the cramp circuit 302, a gate terminal is connected to an INV input terminal and a drain terminal is connected to the source terminal of the NMOS transistor TR9. In the NMOS transistor TR9, a gate terminal is connected to a GRS input terminal and a drain terminal is connected to ground. The BL reset circuit 303 operates by voltage signals INV, GRS which are input from an external control circuit (for example) and resets a charge voltage of a bit line BL before a data programming operation to a memory cell transistor MT is carried out.

The sense circuit 304 is comprised by PMOS transistors TR11, TR12 and a capacitor C_SEN. In the PMOS transistor TR11, a source terminal is connected is a power supply terminal, a gate terminal is connected to an STB input terminal and a drain terminal is connected to the source terminal of the PMOS transistor TR12. In the PMOS transistor TR12, a gate terminal is connected to the capacitor C_CSEN and the cramp circuit 302 and a drain terminal is connected to the source terminal of an NMOS transistor TR13 and the data latch circuit 305. In the capacitor C_SEN, one end is connected to a node SEN and the other end is connected to ground. The sense circuit 304 operates by the voltage signal STB which is input from an external control circuit (for example) and a pre-charge voltage which is supplied from the cramp circuit 302 and senses data stored in memory cell transistors MT connected to a bit line BL.

The data latch circuit 305 is comprised by PMOS transistors TR14-TR16 and NMOS transistors TR17-TR19. In the PMOS transistor TR14, a source terminal is connected to a power supply terminal, a gate terminal is connected an RST input terminal and a drain terminal is connected to the source terminal of the PMOS transistor TR15. In the PMOS transistor TR15, a gate terminal is connected to the drain terminal of the PMOS transistor TR16 and the gate terminal of the NMOS transistor TR17, and a drain terminal is connected to the source terminal of the NMOS transistor TR17. In the PMOS transistor TR16, a source terminal is connected to a power supply terminal, a gate terminal is connected the drain terminal of the PMOS transistor TR15 and the gate terminal of the NMOS transistor TR19, and a drain terminal is connected to the source terminal of the NMOS transistor TR19. In the NMOS transistor TR17, a drain terminal is connected to the source terminal of the NMOS transistor TR18. In the NMOS transistor TR18, a gate terminal is connected to an STB input terminal and a drain terminal is connected to ground. In addition, the drain terminal of the PMOS transistor TR15, the gate terminal of the PMOS transistor TR16 and the gate terminal of the NMOS transistor TR19 are connected to the node INV. In the NMOS transistor TR19, a drain terminal is connected to ground. The data latch circuit 305 operates according to a voltage signal RST INV which is input from an external control circuit for example (not shown in the diagram) and a voltage of the node and latches data which is sensed by the sense circuit 304.

In the NMOS transistor TR10, a source terminal is connected to the clamp circuit 302, a gate terminal is connected to an NCO input terminal and a drain terminal is connected to ground. The NMOS transistor TR10 operates according the voltage signal NCO which is input from an external control circuit for example (not shown in the diagram) and is a transistor for input/output data.

In the NMOS transistor TR13, a source terminal is connected to the above stated node INV, a gate terminal is connected to an RST input terminal and a drain terminal is connected to ground. The NMOS transistor TR13 operates according the voltage signal RST which is input from an external control circuit for example (not shown in the diagram) and is a transistor for resetting a voltage of the node INV.

Figure 4:
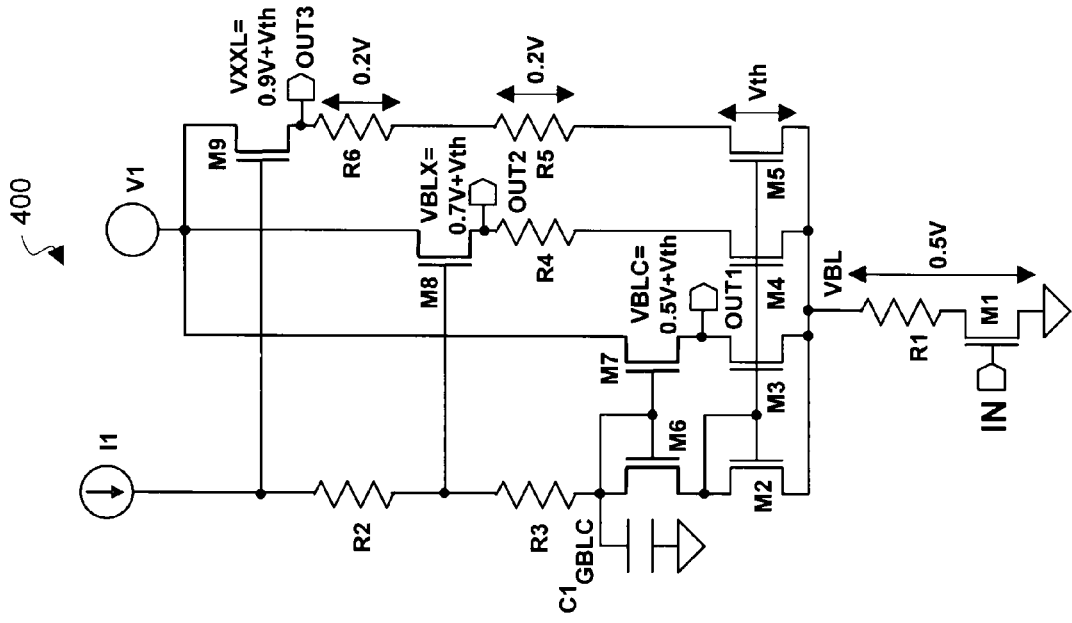
FIG. 4 is a diagram which shows a circuit structure of a gate voltage generation circuit for the sense amplifier S/A related to the first embodiment.

FIG. 4 is a diagram which shows a circuit structure of a gate voltage generation circuit 400 for the sense amplifier S/A shown in FIG. 3. The gate voltage generation circuit 400 is comprised of resistors R1-R6, a capacitor C1, enhancement type NMOS transistors (herein referred to as an E type NMOS transistor) M1-M4 and high-voltage intrinsic type NMOS transistors (herein referred to as high-voltage I type NMOS transistor) M6-M9.

One end of the resistor R2 is connected to a power supply 11 and the gate terminal of the high-voltage I type NMOS transistor M9, and the other end of the resistor R2 is connected to the resistor R3 and the gate terminal of the high-voltage I type NMOS transistor M8. One end of the resistor R3 is connected to one end of the resistor R2 and the gate terminal of the high-voltage I type transistor M8, and the other end of the resistor R3 is connected to a node GBLC. The capacitor C1, the source terminal of the high-voltage I type NMOS transistor M6 and the gate terminals of the high-voltage I type NMOS transistors M6, M7 are connected to the node GBLC. Each of the source terminals of the high-voltage I type NMOS transistors M7 to M9 are connected to the voltage supply V1. The power supply V1 is about 5V. In the high-voltage I type NMOS transistor M7, the gate terminal is connected to the node GBLC, and the drain terminal is connected to an output terminal OUT1 and the source terminal of an E type NMOS transistor M3. In the high-voltage I type NMOS transistor M8, the drain terminal is connected to an output terminal OUT2 and the resistor R4. In the high-voltage I type NMOS transistor M9, the drain terminal is connected to an output terminal OUT3 and the resistor R6. The gate terminals of the E type NMOS transistors M2 to M4 and the source terminal of the E type NMOS transistor M2 are connected to the drain terminal of the high-voltage I type NMOS transistor M6. The drain terminals of the E type NMOS transistors M2 to M4 are connected to the node VBL. The source terminal of the E type NMOS transistor M3 is connected to the drain terminal of the high-voltage I type NMOS transistor M3 and the output terminal OUT3. The source terminal of the E type NMOS transistor M4 is connected to the resistor R4. The source terminal of the E type NMOS transistor M5 is connected to the resistor R5. The resistor R5 is connected to the resistor R6. One of the ends of the resistor R1 is connected to the node VBL, and the source terminal of the E type NMOS transistor M1 is connected to the other end of the resistor R1. In the E type NMOS transistor M1, the gate terminal is connected to an input terminal IN and the drain terminal is connected to ground.

The gate voltage generation circuit 400 generates voltage signals VXXL, VBLX and VBLC which are used at the time of a sense operation within the sense amplifier S/A shown in FIG. 3, and supplies each voltage signal to the XXL input terminal, BLX input terminal and BLC input terminal within the clamp circuit 302 from the output terminals OUT 1 to 3.

Figure 5:
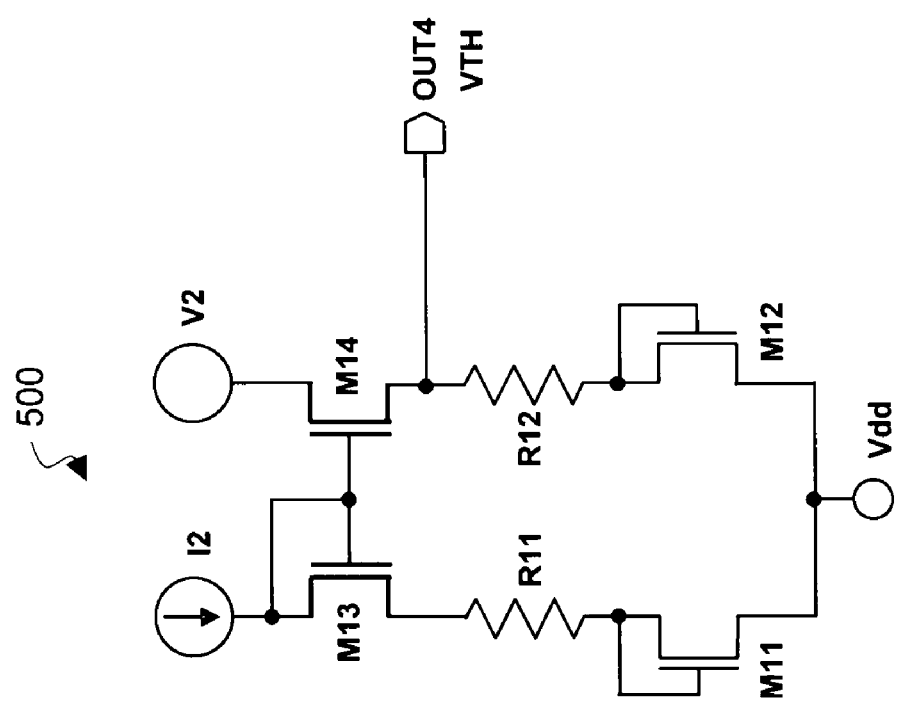
FIG. 5 is a diagram which shows a circuit structure of a power supply circuit for the sense amplifier S/A related to the first embodiment.

FIG. 5 is a diagram which shows a circuit structure of a power supply circuit 500 for the sense amplifier S/A shown in FIG. 3. The power supply circuit 500 is comprised of E type NMOS transistors M11, M12, high-voltage I type NMOS transistors M13, M14 and resistors R11, R12. In the high-voltage I type NMOS transistor M13, the source terminal is connected to a constant current source 12, the gate terminal and the gate terminal of the high-voltage I type NMOS transistor M14, and the drain terminal is connected to the resistor R11. In the high-voltage I type NMOS transistor M14, the source terminal is connected to the power supply V2, and the drain terminal is connected to the resistor R12 and the output terminal OUT4. In the E type NMOS transistor M1, the source terminal is connected to the resistor R11 and the gate terminal, and the drain terminal is connected to a power supply terminal. In the E type NMOS transistor M12, the source terminal is connected to the resistor R12 and the gate terminal, and the drain terminal is connected to a power supply terminal. By using a current mirror circuit which is comprised of the constant current source 12 and the high-voltage I type NMOS transistors M13, M14, the power supply circuit 500 generates a constant voltage VTH at the time of a data programming operation within the sense amplifier S/A shown in FIG. 3, and the constant voltage VTH outputs from the output terminal OUT4.

Next, each operation of the sense amplifier S/A shown in FIG. 3, the gate power generation circuit 400 shown in FIG. 4, and the power supply circuit 400 shown in FIG. 5, will be explained.

First, the operation of the sense amplifier S/A in FIG. 3 will be explained. The node INV of the data latch circuit 305 is reset to ground as an initial operation of a sense operation. At this time, the STB input terminal is a "Hi" level. A high voltage signal BLS of about 8V is applied to the BLS input terminal and the high-voltage NMOS transistor TR1 is turned on. Next, a "Low" level voltage signal FLT is input to the FLT input terminal within the pre-charge circuit 301 and the PMOS transistor TR2 is turned on. Because the INV input terminal which is connected with the gate terminal of the PMOS transistor TR2 is also reset to ground (GND), the PMOS transistor TR3 is also turned on. As a result, a charge operation to the bit line BL from the cramp circuit 302 becomes possible.

For example, in the case where the bit line BL is charged to 0.5V, the voltage signal VBLC which is input to the BLC input terminal within the cramp circuit 302 is set at VBLC=0.5V+Vth. That is, in the gate voltage generation circuit 400 shown in FIG. 4, 0.5V+Vth is output as the voltage signal VBLC from the output terminal OUT1. In addition, by setting the voltage signal VHLL which is input to the HLL input terminal within the cramp circuit 302 to Vdd+Vth, the NMOS transistor TR6 is turned on and the capacitor C_SEN which is connected with the node SEN within the sense amplifier 304, is pre-charged to Vdd. In addition, the voltage signal VXXL which is input to the XXL input terminal within the cramp circuit 302, is set to 0.9V+Vth, and the voltage signal VBLX which is input to the BLX input terminal is set at 0.7+Vth. That is, in the gate voltage generation circuit 400 shown in FIG. 4, 0.9V+Vth is output as the voltage signal VXXL, and 0.7V+Vth is output as the voltage signal VBLX from the output terminals OUT2 and OUT 3. In this way, charging to a bit line BL is initiated by inputting the voltage signals VBLC, HLL, VXXL and VBLX to each input terminal within the clamp circuit 302.

Then, at the point when the bit line BL charge voltage reaches 0.5V, the pre-charge operation to the capacitor C_SEN which is connected to the node SEN is stopped by switching the voltage signal HLL which is input to the HLL input terminal from Vdd+Vth to 0V. In the case where a memory cell transistor MT which is connected via a sense amplifier S/A and a bit line BL, is an on cell in which a current flows, because this cell is in the voltage relationship VXXL>VBLX, the charge voltage of the capacitor C_SEN which is connected to the node SEN is preferentially discharged and a bit line BL is supplied with a voltage. In this way, in the memory transistor MT, the potential of the node SEN decreases as a cell current flows according to a charge voltage, and at the point when 0.7V is reached, because VBLX=0.7V+Vth, a charge voltage is supplied to a bit line BL via the NMOS transistor TR4 in which the voltage signal VBLX is input. Therefore, the potential of the node SEN does not fall below 0.7V.

After a fixed period of time has elapsed from the state of the above stated pre-charge operation, the potential of the node SEN becomes a level which is determined by the cell current which flows in the a memory cell transistor MT. Consequently, when the voltage signal STB which is input to the STB input terminal is switched to "Low", the level of the node SEN within the sense amplifier S/A which is connected to the bit line BL in which a cell current is large, exceeds the threshold level of the PMOS transistor TR12 in which the gate terminal is connected to the node SEN. As a result of this, the PMOS transistor MT12 is turned on. In addition, because the voltage signal STB is "Low", the PMOS transistor MT11 is also turned on and the potential of the node INV within the sense circuit 304 becomes Vdd.

In addition, when the voltage signal STB which is input to the STB input terminal is switched to "Low", the level of the node SEN within the sense amplifier S/A which is connected to the bit line BL in which a cell current is small, does not fall much and is unlikely to exceed the threshold level of the PMOS transistor TR12 in which the gate terminal is connected to the node SEN. As a result, the potential of the node INV within the sense circuit 304 stays at ground (GND). In this way, sensing of the data which is stored in a memory cell transistor MT becomes possible by an operation within the sense circuit 304 after a pre-charge operation.

In addition, during a sense operation, because a bit line BL is supplied with a charge voltage via the NMOS transistor TR4 which is input with a charge voltage of the node SEN or the voltage signal VBLX, it is possible to regularly supply an electric charge which is discharged from a memory cell transistor MT. Therefore, in the NAND type flash memory 100, by using the sense amplifier S/A and the gate voltage generation circuit 400 shown in FIG. 3 and FIG. 4 as the sense amplifier circuit 103, even if all the bit lines BL1-BLm are sensed simultaneously, the voltage of the bit lines BL can be maintained at a constant level. As a result, it is possible to significantly reduce the effects of capacitive coupling between adjacent bit lines BL.

Next, the program operations in the sense amplifier S/A in FIG. 3 will be explained. When a program operation is performed, first, program data is provided to the data latch circuit 305 within the sense amplifier S/A. For example, when data "0" is programmed, the potential of the node INV is set at Vdd and in the case when data "1" is programmed, the potential of the node INV is reset to ground (GND). Then, the voltage signal BLS of about 8V is input to the NMOS transistor TR1 and by inputting the voltage signals VBLC and VBLX which are set at VTH=Vdd+Vth, to the NMOS transistors TR5 and TR4 respectively, the NMOS transistors TR1, TR5 and TR4 are each turned on. When data "0" is programmed to a memory cell transistor MT, each potential of the INV input terminal and the GRS input terminal are both Vdd. As a result, the bit line BL is connected to ground (GND) via the BL reset circuit 303.

In addition, when data "1" is programmed to a memory cell transistor MT, the potential of the INV input terminal is ground (GND). As a result, by switching the voltage signal FLT to "Low", the PMOS transistors TR2 and TR3 are turned on. As a result of this operation, the power supply voltage Vdd is charged to a memory cell transistor MT via the cramp circuit 302 and the bit line BL. At this time, in the case where the potential of the bit line BL is Vdd, the channel of a memory cell transistor MT is cut off by the drain side select gate transistor SDT which is connected to the select gate line SGD. After 0V or Vdd is sufficiently supplied to a bit line BL which is connected to a memory cell transistor MT to be programmed, a program voltage Vpgm of about 20V is applied to a selected word line WL and a pass voltage Vpass of about 10V is applied to the non selected word lines WL.

Following this, a high gate-channel voltage is applied to a memory cell transistor MT to be programmed which is connected to a bit line BL having a potential of 0V, electrons tunnel into the floating gate and data "0" is programmed. In addition, the memory cell transistor MT to be programmed which is connected to a bit line BL with a potential Vdd is cut off. As a result, the channel potential increases due to coupling with the control gate, the potential between the gate-channel decreases and because electron tunneling to the floating gate does not occur, data "1" is programmed.

Next, operations within the gate voltage generation circuit 400 shown in FIG. 4 will be explained. The gate voltage generation circuit 400 generates the voltage signals VBLC=0.5V+Vth, VBLX=0.7V+Vth and VXXL=0.9V+Vth which are used in a sense operation in the above stated sense amplifier S/A. In FIG. 4, the power supply source 11 supplies a constant current and the power supply V1 supplies about 5V. Because a constant current is supplied by the power supply source 11, the potential of the node VBL can be adjusted by changing the resistance value of the resistor R1. In FIG. 4, the potential of the node VBL is assumed to be 0.5V. Because a potential difference of Vth is generated by the E type NMOS transistors M2 to M5, a voltage signal VBLC=0.5V+Vth is output from the output terminal OUT1. The output terminal OUT 2 outputs a voltage signal VBLX=0.7V+Vth by generating a potential difference of 0.2V via the resistor R2. Similarly, the output terminal OUT3 outputs a voltage signal VXXL=0.9V+Vth by generating a potential difference of 0.2V via the resistors R5 and R6. In addition, the capacitor C1 is connected to the node GBLC.

In addition, the voltage signal VTH which is generated in the power supply circuit 500 in FIG. 5 is used when a program operation is performed in the sense amplifier S/A. The power supply circuit 500 uses a current mirror circuit which is comprised from a constant current source 12 and high-voltage I type NMOS transistors M13 and M14. A voltage signal VTH=Vdd+Vth+α (10 μA×R12) is produced in this power supply circuit 500. Furthermore, the constant current source 12 supplies 10 μA.

In the sense amplifier circuit 103 which is arranged with a plurality of sense amplifiers S/A for each bit line BL, when a sense operation and a program operation are performed, all the bit lines BL are simultaneously charged. As a result, a large current peak is generated at the time of a charge operation. A voltage drop in the power supply voltage Vdd and a fluctuation in the ground potential Vss occurs with the generation of this current peak and is this is likely to cause damage to the latch data or errors in a logic operation.

Below, a gate voltage generation circuit which controls a current peak which is generated when a bit line BL is charged by controlling a voltage increase of the voltage signals VBLC, VBLX generated in the gate voltage generation circuit 400 shown in FIG. 4, is explained.

Figure 6:
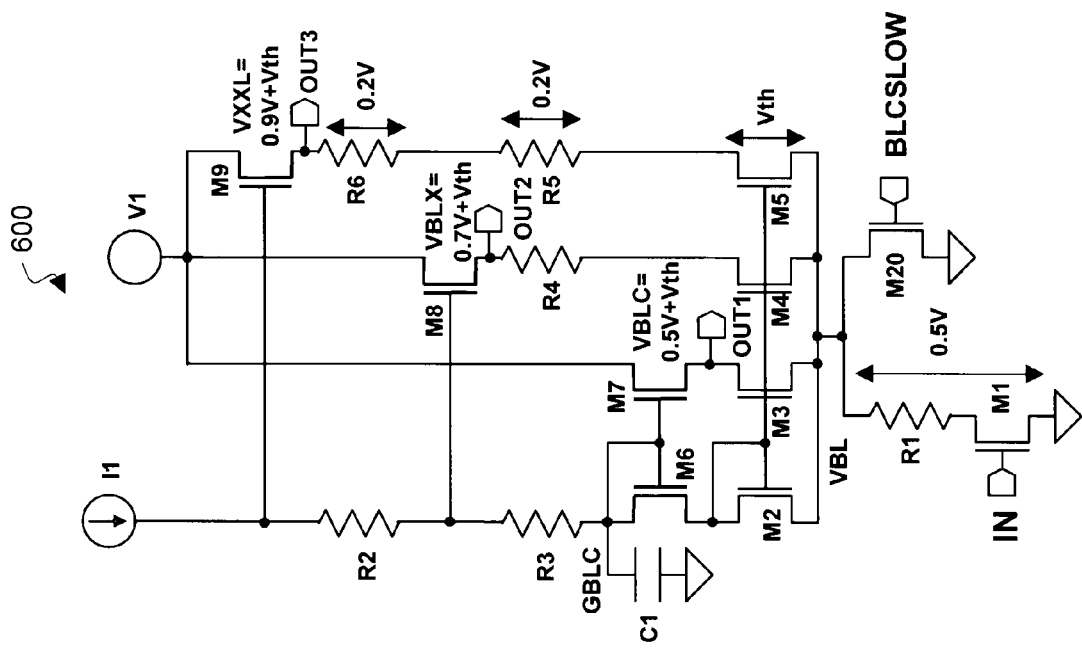
FIG. 6 is a diagram which shows a circuit structure of a gate voltage generation circuit which controls a current peak related to the first embodiment.

FIG. 6 is a diagram which shows a circuit structure of a gate voltage generation circuit 600 (including a transient response adjustment circuit) which controls a current peak which is generated when a bit line BL is charged. Furthermore, in FIG. 6, the same structural elements as the gate voltage generation circuit 400 have the same symbols and therefore explanations will be omitted to avoid repetition.

In FIG. 6, in the gate voltage generation circuit 600, a resistor R1 which is connected to the node VBL and an E type NMOS transistor M1 and an E type NMOS transistor M20 are connected in parallel. These structural elements are different to the gate voltage generation circuit 400 shown in FIG. 4.

In the E type NMOS transistor M20, the source terminal is connected to the node VBL, the gate terminal is connected to a BLCSLOW input terminal and the drain terminal is connected to ground. The E type NMOS transistor M20 operates by a voltage signal BLCSLOW which is input to the gate terminal and a discharge pass which discharges the potential of the node VBL to ground (GND) is formed. Here, the voltage signal which controls the discharge operation of the E type NMOS transistor M20 is called BLCSLOW.

Next, the charging operation of the gate voltage generation circuit 600 will be explained by referring to the timing chart of each signal shown in FIG. 6 and FIG. 7. FIG. 7A is a timing chart of each signal related to a charging operation by the gate voltage generation circuit 600. FIG. 7B is a timing chart of each signal related to a charging operation by the gate voltage generation circuit 400. Next, each waveform shown in FIGS. 7A and 7B will be explained. [BL] is the waveform of a charge voltage of a bit line BL. [BLC] is a waveform of a voltage signal input to the BLC input terminal within the cramp circuit 302. [BLX] is a waveform of a voltage signal input to the BLX input terminal within the cramp circuit 302. [BLCSLOW] is a waveform of a voltage signal BLCSLOW. [VBLC] is a waveform of a voltage signal VBLC output from the output terminal OUT1 in the gate voltage generation circuit 600. [VBLX] is a waveform of a voltage signal VBLX output from the output terminal OUT2 in the gate voltage generation circuit 600.

When the voltage signal BLCSLOW is input to the BLCSLOW input terminal of the gate voltage generation circuit 600 (refer to [BLCSLOW:"Hi"] at the timing t1 in FIG. 7A), the E type NMOS transistor M20 is turned on and the potential of the node VBL is discharged to ground (GND). Each potential of the voltage signals VBLC, VBLX and VXXL drops to Vth, Vth+0.2V and Vth+0.4V respectively due to this discharge, and these potentials are maintained while the voltage signal BLCSLOW is input (refer to [VBLC], [VBLX] during the timing between t1 and t2 in FIG. 7A).

Next, when the voltage signal BLCSLOW is stopped, the E type NMOS transistor M20 is turned off and the potential of the voltage signal VBLC begins to rise (refer to [VBLC] after the timing t2 in FIG. 7A). At this time, because the node VBL is charged with a constant current from the power supply source 11, the potential of the node VBL increases linearly. In other words, each potential of the voltage signals VBLC, VBLX and VXXL also increase at a constant gradient (refer to [VBLC], [VBLX] after the timing t2 in FIG. 7A).

The voltage signals VBLC, VBLX and VXXL which change as described above, are input to each gate terminal of the NMOS transistors TR4, TR5 and TR7 which are connected to the input terminals BLC, BLX and XXL within the cramp circuit 302 of the sense amplifier S/A. Here, particularly, consideration is paid to the voltage signal VBLC which is input to the NMOS transistor TR5 which connects a bit line BL and the sense amplifier S/A. The output terminal OUT1 of the BLC input terminal and the gate voltage generation circuit 600 is connected via a transfer gate circuit described below. When charging to the bit line BL begins, the voltage signal VBLC is input to the BLC input terminal by switching on the transfer gate circuit. Then, charging to a bit line BL by the voltage signal VBLC begins via the high-voltage NMOS transistor TR1 by turning on the NMOS transistor TR5.

Next, each operation of the gate voltage generation circuit 600 and gate voltage generation circuit 400 will be compared and further explained by referring to the timing charts in FIGS. 7A and 7B.

As is shown in FIG. 7B, in the gate voltage generation circuit 400 which is not connected to the E type NMOS transistor M20, the voltage signal VBLC is generated and when a charging operation to the bit line BL begins (timing t1 in FIG. 7B), the voltage signal input to the BLC input terminal within the cramp circuit 302 of the sense amplifier S/A, rises sharply (from t1 to t2 in FIG. 7B). Because the NMOS transistor TR5 is immediately turned on by this voltage signal, a charge current flows to the bit line BL in a single burst and a large current peak is generated.

In the gate voltage generation circuit 600 which is connected to the E type NMOS transistor 20, as is shown in FIG. 7A, before a charging operation to the bit line BL begins (timing t1 in FIG. 7A), when the voltage signal BLCSLOW ("Hi") is input, the E type NMOS transistor M20 is turned on and the potential of the node VBL drops to Vth by discharging the potential of the node VBL to ground (GND). When a charging operation to the bit line BL begins in this state (timing t2 in FIG. 7A), the potential of the voltage signal VBLC increases sharply to Vth and the potential of the BLC input terminal within the cramp circuit 302 also increases sharply to Vth. In this case, although the potential of the BLC input terminal increases sharply to Vth, because the threshold level of the NMOS transistor TR5 is not exceeded, a charge current does not rapidly flow to the bit line BL. Furthermore, when the voltage signal VBLC drops to 0V, a charge current does not flow to the bit line BL until the potential of eth BLC input terminal reaches Vth. Because the time until the potential of this BLC input terminal reaches Vth results in lost discharge time, the voltage signal VBLC does not drop to 0V.

After the potential of the BLC input terminal has reached Vth, the potential of the input terminal BLC also rises linearly along with the potential of the voltage signal VBLC which also rises linearly (from timing t2 to t3 in FIG. 7A). In other words, a charge current begins to flow to the bit line. Here, the charging operation speed to a bit line is determined by the speed of increase of the voltage signal which is input to the BLC input terminal. That is, the charging operation speed (transient response) to a bit line BL is determined by the speed of increase of the voltage signal BLC which is generated in the gate voltage generation circuit 600. The speed of increase of this voltage signal BLC can be determined by the capacitance value of the capacitor C1 which is connected to the node GBLC within the gate voltage generation circuit 600. In the present first embodiment, by adjusting the capacitance value of the capacitor C1 and controlling the speed of increase of the voltage signal VBLC, the sharp increase of the charge current which flows to the bit line BL is alleviated and the generation of a current peak is avoided. Actually, because the speed of increase of the voltage signal VBLC is further reduced by wiring capacity or load carrying capacity of a wire which connects the gate voltage generation circuit 600 and the sense amplifier S/A, the speed of increase of a charge current can be further reduced and the generation of a current peak can be avoided.

The sense amplifier circuit 103 used in the NAND type flash memory 100 related to the first embodiment has a structure which includes an E type NMOS transistor M20 and a capacitor C1 (transient response adjustment circuit) which control (adjusts) the speed of increase (transient response) of a charge current which flows to a bit line BL in the gate voltage generation circuit 600 which generates a voltage signal related to a charge operation of a sense amplifier S/A connected to each bit line BL. As a result, in the cramp circuit 302 within the sense amplifier S/A which supplies a charge current to a bit line BL, it is possible to alleviate the sharp increase of the voltage signal VBLC which is input to the gate terminal of the NMOS transistor TR5 related to a charge operation, and alleviate the generation of a current peak when a charge current begins to flow. Therefore, in the NAND type flash memory 100, it is possible to prevent the generation of a current peak at the time of a charge operation and thus a voltage drop of the power supply voltage Vdd or a fluctuation in the ground voltage Vss and it is also possible to avoid damage to the latch data or errors in logic operations.

Second Embodiment

Figure 8A:
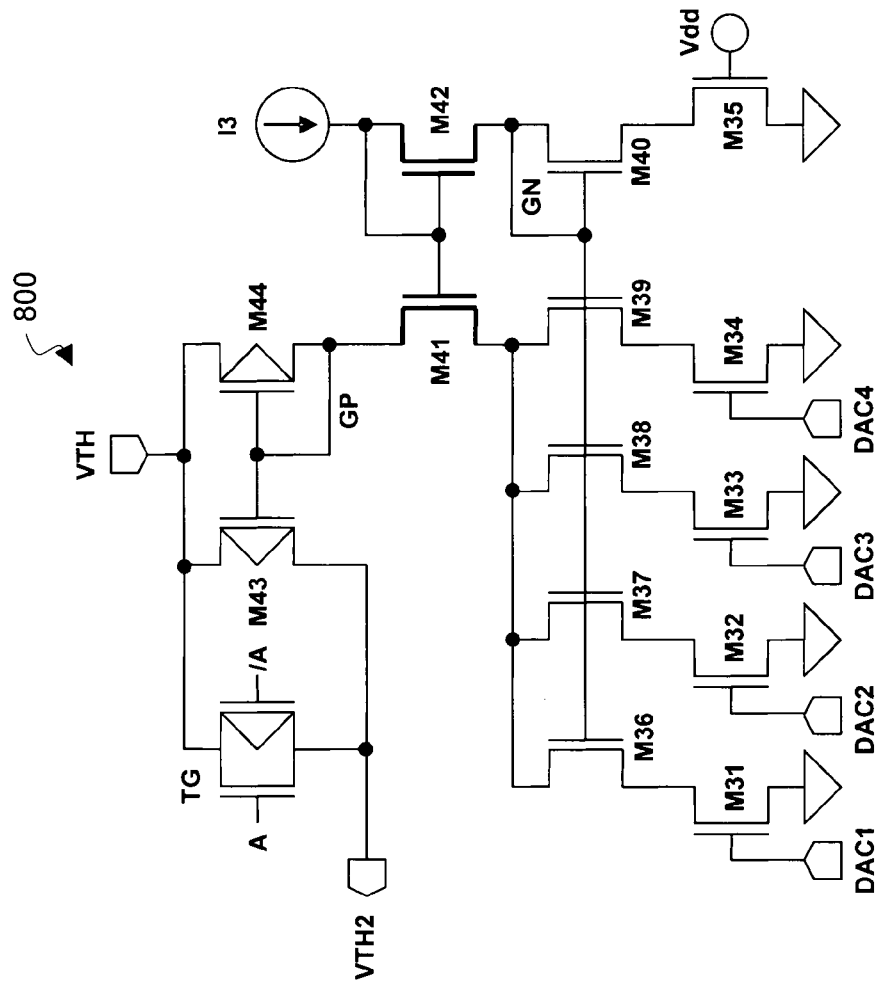
FIG. 8 is a diagram which shows a circuit structure of a gate voltage generation circuit for a sense amplifier S/A related to a second embodiment.
Figure 8B:
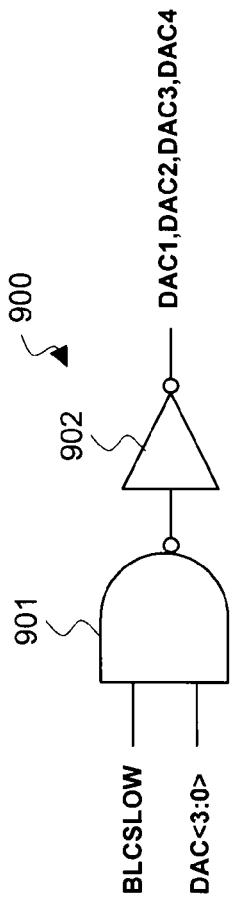

FIG. 8 is a diagram which shows a circuit structure of the gate voltage generation circuit which is applied in the NAND type flash memory related to the second embodiment. FIG. 8A is a diagram which shows a circuit structure of the gate voltage generation circuit (including a transient response adjustment circuit) 800. FIG. 8B is a diagram which shows a circuit structure of a drive capability adjustment circuit 900 which adjusts the drive capability of the gate voltage generation circuit 800. Furthermore, because the structure of the NAND type flash memory related to the second embodiment is the same as that shown in FIG. 1, diagrams and structure explanation are omitted here. In addition, because the structure of the sense amplifier S/A related to the second embodiment is the same as that shown in FIG. 3, diagrams and structure explanation are omitted here.

The gate voltage generation circuit 800 is comprised of E type NMOS transistors M31-M40, high-voltage I type NMOS transistors M41, M42, PMOS transistors M43, M44 and a transfer gate TG. In the E type NMOS transistors M31-M40, each source terminal is connected to the drain terminal of the E type NMOS transistors M36-M40 and each drain terminal is connected to ground. In the E type NMOS transistors M31-M34, each gate terminal is connected to input terminals DAC1-DAC4. The gate terminal of the E type NMOS transistor M35 is connected to a power supply terminal (Vdd). In the E type NMOS transistors M36-M39, each source terminal is connected to a drain terminal of the high-voltage I type NMOS transistor M41 and each gate terminal is connected to node GN. The source terminal and gate terminal of the E type NMOS transistor M40 are connected the drain terminal of the high-voltage I type NMOS transistor M42 and node GN. In the high-voltage I type NMOS transistor M41, the source terminal is connected to the drain terminal (node GP) of the PMOS transistor M44, and the gate terminal is connected to constant power source 13 and the gate terminal of the high-voltage I type NMOS transistor M42. In the high-voltage I type NMOS transistor M42, the source terminal and the gate terminal are connected to the constant power source 13 and the gate terminal of the high-voltage I type NMOS transistor M41. Each source terminal in the PMOS transistors M43, M44, and the source terminal of the transfer gate TG is connected to the VTH input terminal. Each gate terminal in the PMOS transistors M43, M44, is connected to the node GP. The drain terminal of the PMOS transistor M43 and the drain terminal of the transfer gate TG are connected to the VTH2 output terminal. A gate signal A, /A is input to each gate terminal of the transfer gate TG. Furthermore, the constant power source 13 supplies 10 μA. In addition, a constant voltage VTH is input to the VTH input terminal.

The PMOS transistors M43, M44 and the I type NMOS transistors M41, M42 are comprised of a current mirror circuit and output the voltage signal VTH2. The E type NMOS transistors M31-M34, are selectively turned on by adjustment signals DAC1-DAC4 which are input from the drive capability adjustment circuit 900 described below, and the drive capability of the voltage signal VTH2 which is output from the current mirror circuit is adjusted. The transfer gate TG is turned on when the gate signal A ("Hi"), /A ("Low") is input and a voltage signal VTH2 of the same potential as a constant voltage VTH which is input to the input terminal VTH is output from the VTH2 output terminal. In addition, the transfer gate TG is turned off when the voltage signal BLCSLOW which is input to the drive capability adjustment circuit 900 is "Hi".

In FIG. 8B, the drive capability adjustment circuit (adjustment value setting circuit) 900 is comprised of a NAND gate 901 and an inverter 902. When the voltage signal BLCSLOW is "Hi" the NAND gate 901 transmits a drive capability adjustment signal DAC <3:0> to the inverter 902. The inverter 902 outputs adjustment signals DAC1-DAC4 corresponding to the drive capability adjustment signal DAC <3:0> to each gate terminal of the E type NMOS transistors M31-M34, and the E type NMOS transistors M31-M34 are selectively turned on.

Next, the charge operation of a bit line BL by the gate voltage generation circuit 800 and the drive capability adjustment circuit 900 will be explained while referring to the timing chart shown in FIG. 9. FIG. 9A is a timing chart of each signal related to a charge operation when BLCSLOW is input in the gate voltage generation circuit 800. FIG. 9B is a timing chart of each signal related to a charge operation when BLCSLOW is not input in the voltage generation circuit 800. Next, each waveform shown in FIGS. 9A and 9B will be explained. [BL] is the waveform of a charge voltage of a bit line BL. [BLC] is a waveform of a voltage signal input to the BLC input terminal within the cramp circuit 302. [BLX] is a waveform of a voltage signal input to the BLX input terminal within the cramp circuit 302. [BLCSLOW] is a waveform of a voltage signal BLCSLOW. [VTH2] is a waveform of a voltage signal VTH2 output from the VTH2 output terminal in the gate voltage generation circuit 800.

At the time of a programming operation, a bit line BL is charged up to the power supply voltage Vdd. Apart from the time of a charge operation, the transfer gate TG within the gate voltage generation circuit 800 is turned on, the VTH input terminal and the VTH2 output terminal are connected via the transfer gate TG, and the voltage signal VTH2 which is the same potential as a constant potential VTH is supplied to the sense amplifier S/A from the VTH2 output terminal. The VTH2 output terminal, the BLC input terminal and BLX input terminal of the cramp circuit 302 within the sense amplifier S/A are connected by a transfer gate circuit described below. By turning on this transfer gate circuit on when a bit line BL charge operation begins, the VTH2 output terminal, BLC input terminal and BLX input terminal are connected.

In the case where the voltage signal BLCSLOW is not input at the time of a bit line BL charge operation, the voltage signal BLC flows in one burst at the same time as the start of the charge operation of a bit line BL and a current peak is generated as is shown in FIG. 9B (from t1 to t2 in FIG. 9B).

In addition, as is shown in FIG. 9A, when a charge operation to a bit line BL begins the voltage signal BLCSLOW is set to "Hi" (timing t1 in FIG. 9A). At this time, the transfer gate TG within the gate voltage generation circuit 800 is turned off, the adjustment signals DAC1-DAC4 corresponding to the drive capability adjustment signal DAC <3:0> which is output from the drive capability adjustment circuit 900 become effective and the operations if the current mirror circuit within the gate voltage generation circuit 800 becomes effective. An AND gate 901 of the drive capability adjustment circuit 900 makes an AND operation of a the voltage signal BLCSLOW and the drive capability adjustment signal DAC <3:0>. As a result, by changing the setting of the drive capability adjustment signal DAC <3:0> the adjustment signals DAC1-DAC4 are selectively set to "Hi". Then, the adjustment signals DAC1-DAC4 turn on the E type NMOS transistors M31-M34. As a result of this, it is possible to change the drive capability of the voltage signal VTH2 which is output to the VTH2 output terminal from the current mirror circuit. Therefore, the drive capability adjustment circuit 900 includes a transient response adjustment function which adjusts a sharp increase (transient response) of a charge current when a charge operation begins.

In addition, by setting the voltage signal BLCSLOW to "Hi" the above stated transfer gate circuit is turned on, the VTH2 output terminal, the BLC input terminal and BLX input terminal within the cramp circuit 302 of the sense amplifier S/A are connected, and a charge operation to a bit line BL beings by the voltage signal VTH2. At this time, due to charge a wiring capacity or a load carrying capacity between the BLC input terminal and the BLX input terminal, the voltage signal VTH2 which is shown in FIG. 9A decreases sharply.

After this, the potential of the node GP within the gate voltage generation circuit 800 decreases via the selected E type NMOS transistors M31-M34 and becomes lower than the potential of the constant voltage VTH which is input to the VTH input terminal. Due to this decrease in the potential of the node GP the voltage signal VTH2 is charged by the constant voltage VTH from the VTH input terminal via the PMOS transistors M43, M44. That is, the potential of the voltage signal VTH2 shown in FIG. 9A gradually increases. At this time, to a certain extent it is possible to freely control the speed of charging the voltage signal VTH2 by selectively turning on the E type NMOS transistors M31-M34 by the adjustment signals DAC-DAC4.

In addition, by combining the gate voltage generation circuit 800 shown in FIG. 8 with the gate voltage generation circuit 600 shown in FIG. 6 it is possible to perform a bit line BL charging operation. The voltage signal BLCSLOW which is input to each of the gate voltage generation circuits 600, 800 respectively is the same signal. In this case, an example structure of the transfer gate circuit is shown in FIG. 10 which selects between the voltage signal VBLC which is output from the output terminal OUT1 (VBLC) within the gate voltage generation circuit 600 and the voltage signal VTH2 which is output from the VTH2 output terminal within the gate voltage generation circuit 800 and inputs to the BLC input terminal within the cramp circuit 302 of the sense amplifier S/A.

Figure 10:
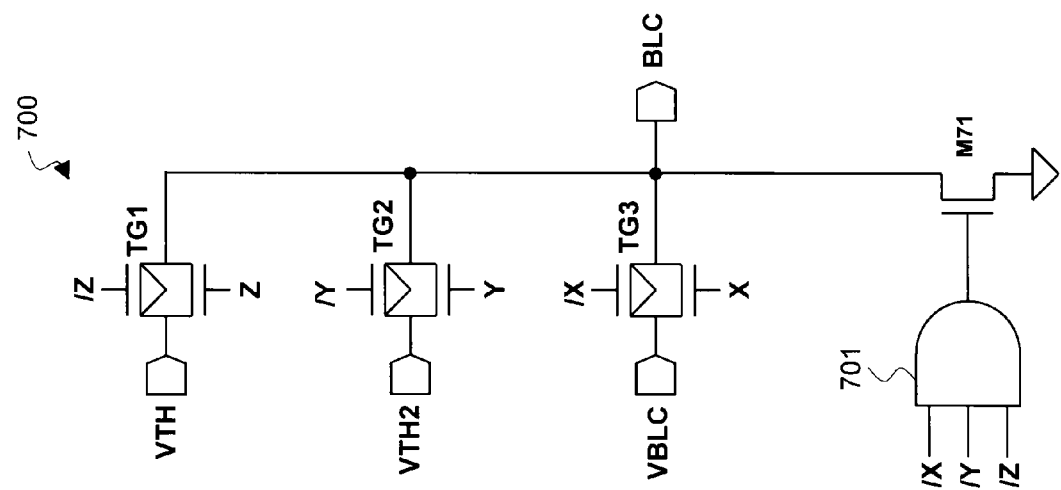
FIG. 10 is a diagram which shows a circuit structure of a drive ability adjustment circuit related to the second embodiment.

A transfer gate circuit 700 as shown in FIG. 10 is comprised of transfer gates TG1-TG3, an AND gate 701 and an NMOS transistor M71. The transfer gate TG1 is turned on when a gate signal Z, /Z is input and supplies the constant voltage VTH to the BLC input terminal. The transfer gate TG2 is turned on when a gate signal Y, /Y is input and supplies the voltage signal VTH2 to the BLC input terminal. The transfer gate TG3 is turned on when a gate signal X, /X is input and supplies the voltage signal VBLC to the BLC input terminal. The AND gate 701 outputs an AND operation of the gate signals /X, /Y, /Z which are input from an external control circuit (not shown in the diagram) to the gate terminal of the NMOS transistor M71. The NMOS transistor M71 is turned on when the AND operation input from the AND gate 701 is "Hi" and it is possible to output the constant voltage VTH, the voltage signal VTH2 or the voltage signal VBLC to the BLC input terminal. Furthermore, the gate signals /X, /Y, /Z, are inverted the gate signals X, Y, Z.

Next, the operation of the transfer gate circuit 700 will be explained while referring to the timing chart in FIG. 11. Next, each waveform shown in FIG. 11 will be explained. [BLCSLOW] is a waveform of the voltage signal BLCSLOW and [X] is a waveform of gate signal X. [Y] is a waveform of the gate signal Y and [Z] is a waveform of the gate signal Z. [VBLC] is a waveform of the voltage signal VBLC. [VTH2] is a waveform of the voltage signal VTH2. [BLC] is a waveform which shows a potential change in the BLC input terminal. [BL] is the waveform of a charge voltage of a bit line BL.

Figure 11:
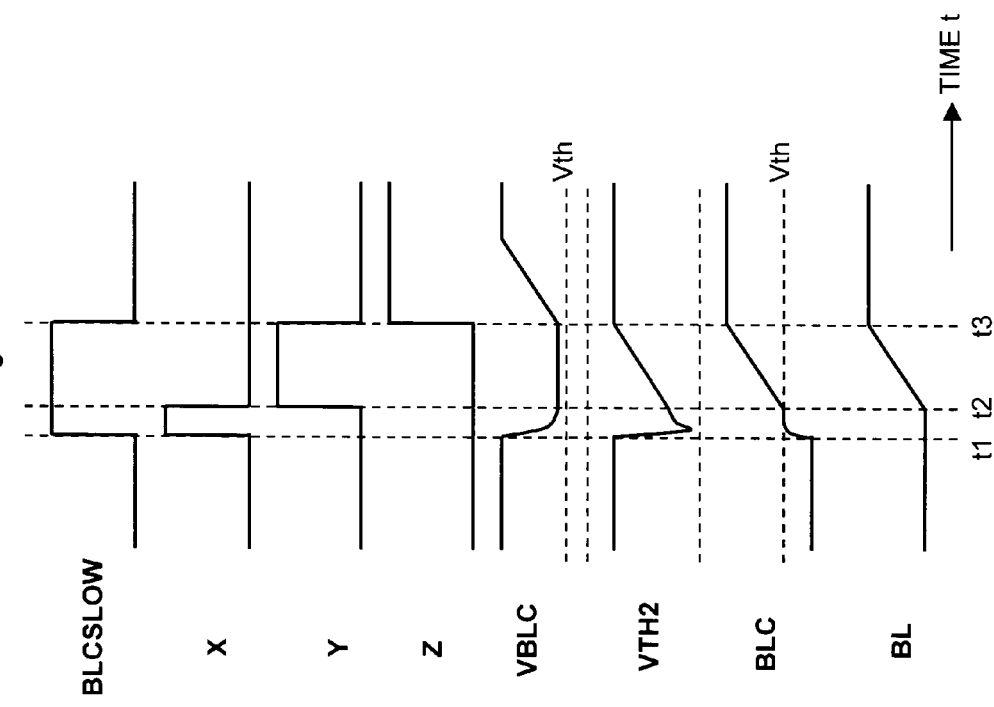
FIG. 11 is a timing chart of each signal related to a charging operation by the drive ability adjustment circuit related to the second embodiment.

At the timing t1 shown in FIG. 11, when the voltage signal BLSCLOW and the gate signal X are simultaneously set to "Hi", the potential of the output terminal OUT1 (VBLC) within the gate voltage generation circuit 600 drops to a threshold voltage VTH of the E type NMOS transistor M3 because the E type NMOS transistor M20 is turned on. At this time, the transfer gate TG3 within the transfer gate circuit 700 is turned on and the output terminal OUT1 (VBLC) within the gate voltage generation circuit 600, and the BLC input terminal of within the cramp circuit 302 of the sense amplifier S/A are connected.

By the above stated initial operation, the potential of the BLC input terminal within the cramp circuit 302 of the sense amplifier S/A increases sharply to Vth (the timing t1 of (BLC) in FIG. 11). After this, at the timing t2 shown in FIG. 11, leaving the voltage signal BLCSLOW "Hi", when the gate signal X is set to "Low" and the gate signal Y is set to "Hi", the transfer gate TG1 is turned off a and the transfer gate TG2 is turned on. By this operation the output terminal VTH2 within the gate voltage generation circuit 800, and the BLC input terminal of within the cramp circuit 302 of the sense amplifier S/A are connected.

Then, A constant current in which a drive capability has been adjusted by the adjustment signals DAC1-DAC4 in an operation of the above stated current mirror circuit, is supplied from the VTH2 output terminal of the gate voltage generation circuit 800 to the BLC input terminal. As a result, as is shown from t2 to t3 of [BLC] in FIG. 11, the potential of the BLC input terminal increases from Vth to VTH2.

As in the operation stated above, by switching the voltage signal VBLC output from the gate voltage generation circuit 600, and the voltage signal VTH2 output from the gate voltage generation circuit 800 using the transfer gate circuit 700, it becomes possible to reduce the time in which potential of the BLC input terminal is increased to Vth by supplying the voltage signal to the BLC input terminal within the cramp circuit 302 of the sense amplifier S/A.

In addition, in the gate voltage generation circuit 800, by appropriately changing the settings of the adjustment signals DAC1-DAC4 which are output from the drive capability adjustment circuit 900 to correspond with the allowable charge time of a bit line BL, it is possible to prevent a current peak from occurring in the charge current which flows to the bit line BL. For example, in the case where a bit line BL is charge at the time of an erasure operation, because the allowable charge time is sufficiently longer compared to during a program operation, it is possible to control charge current which flow to a bit line by setting the adjustment signals DAC1-DAC4.

As described above, the sense amplifier circuit 103 used in the NAND type flash memory 100 related to the second embodiment has a structure which includes a drive capability adjustment circuit 900 sets the adjustment signals DAC1-DAC4 which control the speed of increase of a charge current which flows to a bit line BL in the gate voltage generation circuit 800 which generates a voltage signal related to a charge operation of a sense amplifier S/A connected to each bit line BL. As a result, in the cramp circuit 302 within the sense amplifier S/A which supplies a charge current to a bit line BL, it is possible to alleviate the sharp increase of the voltage signal VBLC which is input to the gate terminal of the NMOS transistor TR5 related to a charge operation, and alleviate the generation of a current peak when a charge current begins to flow. Therefore, in the NAND type flash memory 100, it is possible to prevent the generation of a current peak at the time of a charge operation and thus a voltage drop of the power supply voltage Vdd or a fluctuation in the ground voltage Vss and it is also possible to avoid damage to the latch data or errors in logic operations.

In addition, by setting the drive capability adjustment signal DAC <3:0> which is input from an external control circuit for example, it is possible arbitrarily set the adjustment signals DAC1-DAC4 in the drive capability adjustment circuit 900. As a result, it is possible to easily control an increase in speed of a charge current corresponding to an allowable charge time, when charging a bit line BL at the time of a programming or erasure operation.

Furthermore, a NAND type flash memory was exemplary shown in the above stated first and second embodiments, however, the present invention can also be applied to other memories in which bit line BL capacity becomes large due to miniaturization and large capacity.

What is claimed is:

1. A semiconductor memory device comprising:
a memory string in which a plurality of memory cells are connected;
a bit line connected to an end of said memory string;
a power supply circuit which generates a voltage or a current related to an operation state of each memory cell of said plurality of memory cells within said memory string;
a sense amplifier circuit which supplies a control voltage or a control current which controls an operation state of each memory cell of said plurality of memory cells within said memory string via said bit line according to said voltage or said current generated in said power supply circuit, and detects an operation state of said memory string; and
a transient response adjustment circuit which adjusts the transient response characteristics of said voltage or said current generated in said power supply circuit when said sense amplifier circuit supplies to said bit line said control voltage or said control current which shifts said memory string from a first operation state to a second operation state.

2. The semiconductor memory device according to claim 1, wherein said power supply circuit generates a charging voltage or a charging current related to a read operation of each memory cell of said plurality of memory cells within said memory string, said sense amplifier circuit detects a storage state of data of each memory cell of said plurality of memory cells after charging said bit line which is connected to said memory string, according to said charging voltage or said charging current generated in said power supply circuit, and said transient response adjustment circuit adjusts the transient response characteristics of said charging voltage or said charging current which are generated in said power supply circuit, when said sense amplifier circuit charges said bit line.

3. The semiconductor memory device according to claim 2, wherein said sense amplifier circuit includes a transistor circuit for executing a charging operation to said bit line according to said charging voltage or said charging current, and said transient response adjustment circuit adjusts said the transient response characteristics of said charging voltage or said charging current according to a threshold voltage which said transistor circuit operates.

4. The semiconductor memory device according to claim 3, wherein said transient response adjustment circuit adjusts the transient response characteristics of said charging voltage or said charging current in a period until a gate voltage of said transistor circuit reaches said threshold voltage and also in a period until said charging voltage or said charging current reaches a predetermined level.

5. The semiconductor memory device according to claim 1, wherein said transient response adjustment circuit adjusts the transient response characteristics of said charging voltage or said charging current generated from said power supply circuit, when said control voltage or said control current which shifts said memory string from a discharge operation which is said first operation state to a charging operation which is said second operation state, is supplied to said bit line.

6. The semiconductor memory device according to claim 5, wherein said transient response adjustment circuit is arranged with a transistor circuit which adjusts the transient response characteristics of said charging voltage or said charging current which are generated from said power supply circuit in said discharge operation of said memory string.

7. The semiconductor memory device according to claim 6, wherein said transistor circuit forms a discharge pass according to an externally input signal in said discharge operation of said memory string.

8. The semiconductor memory device according to claim 5, wherein said transient response adjustment circuit is arranged with a condenser circuit which adjusts the transient response characteristics of said charging voltage or said charging current which are generated from said power supply circuit in said discharge operation of said memory string.

9. The semiconductor memory device according to claim 7, wherein said condenser circuit adjusts the rising speed of said charging voltage or said charging current which are generated from said power supply circuit by adjusting a capacitance value, and also adjusts the transient response characteristics of said charging voltage or said charging current which are applied to said bit line.

10. A semiconductor memory device comprising:
a memory string in which a plurality of memory cells are connected;
a bit line connected to an end of said memory string;
a power supply circuit which generates a voltage or a current related to an operation state of each memory cell of said plurality of memory cells within said memory string;
a sense amplifier circuit which supplies a control voltage or a control current which controls an operation state of each memory cell of said plurality of memory cells within said memory string via said bit line according to said voltage or said current generated in said power supply circuit, and detects an operation state of said memory string;
a transient response adjustment circuit which adjusts the transient response characteristics of a charge voltage or a charge current generated in said power supply circuit when said sense amplifier circuit supplies to said bit line said control voltage or said control current which controls a charge operation of said memory string; and
an adjustment value setting circuit which sets an adjustment value which adjusts the transient response characteristics of said charge voltage or said charge current.

11. The semiconductor memory device according to claim 10, wherein said transient response adjustment circuit adjusts the transient response characteristics of said charging voltage or said charging current which are generated from said power supply circuit, when said sense amplifier circuit charges said bit line.

12. The semiconductor memory device according to claim 11, wherein said transient response adjustment circuit is arranged with a transistor circuit which adjusts the transient response characteristics of said charging voltage or said charging current which are generated from said power supply circuit when said bit line is charged.

13. The semiconductor memory device according to claim 12, wherein said transistor circuit adjusts the rising speed of said charging voltage or said charging current which are generated from said power supply circuit according to said adjustment value which is set by said adjustment value setting circuit, and also adjusts the transient response characteristics of said charging voltage or said charging current which are applied to said bit line.

14. The semiconductor memory device according to claim 13, wherein said transistor circuit is comprised by a plurality of transistors connected in parallel, and said transistor circuit adjusts the rising speed of said charging voltage or said charging current which are generated from said power supply circuit by selectively driving said plurality of transistors according to said adjustment value.

15. The semiconductor memory device according to claim 10, wherein said adjustment value setting circuit is comprised from a logic operation circuit, and said adjustment value setting circuit sets said adjustment value by a logic operation of a drive capability adjustment signal which is externally input.

16. The semiconductor memory device according to claim 15, wherein said adjustment value setting circuit changes a setting of said adjustment value according to a change in said drive capability adjustment signal.

* * * * *